United States Patent
O'Neill et al.

(10) Patent No.: US 9,412,670 B2
(45) Date of Patent: Aug. 9, 2016

(54) SYSTEM, METHOD AND APPARATUS FOR RF POWER COMPENSATION IN PLASMA ETCH CHAMBER

(71) Applicant: Lam Research Corporation, Fremont, CA (US)

(72) Inventors: Robert G. O'Neill, Fremont, CA (US); Arthur Sato, Fremont, CA (US); Eric Tonnis, Fremont, CA (US); Seetharaman Ramachandran, Fremont, CA (US); Shang-I Chou, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 117 days.

(21) Appl. No.: 13/901,535

(22) Filed: May 23, 2013

(65) Prior Publication Data

US 2014/0349417 A1    Nov. 27, 2014

(51) Int. Cl.
| | |
|---|---|
| *H01L 21/00* | (2006.01) |
| *G01L 21/30* | (2006.01) |
| *H01L 21/66* | (2006.01) |
| *H01J 37/32* | (2006.01) |

(52) U.S. Cl.
CPC ........... *H01L 22/12* (2013.01); *H01J 37/32082* (2013.01); *H01J 37/3299* (2013.01); *H01J 37/32935* (2013.01)

(58) Field of Classification Search
CPC ..................... H01J 37/32082; H01J 37/32935; H01J 37/3299; H01L 22/12

USPC .................................................. 438/5; 216/67
See application file for complete search history.

(56) References Cited

U.S. PATENT DOCUMENTS

| | | | |
|---|---|---|---|
| 6,781,317 B1* | 8/2004 | Goodman | 315/111.21 |
| 8,492,980 B2* | 7/2013 | Banna et al. | 315/111.21 |
| 8,686,711 B2* | 4/2014 | Tanaka | H01J 37/32183 118/723 E |
| 2004/0061448 A1* | 4/2004 | Avoyan et al. | 315/111.21 |
| 2006/0042753 A1* | 3/2006 | O'Leary et al. | 156/345.1 |
| 2007/0050076 A1* | 3/2007 | Yamazaki | G05B 23/024 700/121 |
| 2014/0265851 A1* | 9/2014 | Albarede | 315/111.21 |
| 2015/0028744 A1* | 1/2015 | Valcore, Jr. | H01J 37/32926 315/111.21 |

* cited by examiner

*Primary Examiner* — Nadine Norton
*Assistant Examiner* — Christopher Remavege
(74) *Attorney, Agent, or Firm* — Martine Penilla Group, LLP

(57) ABSTRACT

A system and method of applying power to a target plasma chamber include, characterizing a no plasma performance slope of the target plasma chamber, applying a selected plasma recipe to a first wafer in the target chamber, the selected plasma recipe includes a selected power set point value and monitoring a recipe factor value on the RF electrode. A ratio of process efficiency is generated comparing the reference chamber and the target chamber, the generating using as inputs the no plasma performance slopes of the target chamber and the reference chamber and the monitored recipe factor value. An adjusted power set point value is calculated, the adjusted power set point configured to cause power delivered to a plasma formed in the target chamber to match power that would be delivered to a reference plasma formed in the reference chamber.

19 Claims, 9 Drawing Sheets

SYSTEM, METHOD AND APPARATUS FOR RF POWER COMPENSATION IN PLASMA ETCH CHAMBER

BACKGROUND

The present invention relates generally to plasma process chambers, and more particularly, to methods and systems for applying a desired power input to the plasma.

Variability in RF power delivery to a plasma reactor chamber can be caused by RF current flowing through components which absorb RF power at locations downstream of the calibration location. In plasma processing of semiconductor wafers, the variability in RF power delivered to the plasma and associated process shifts causes process variability from a first plasma chamber to a second plasma chamber in the absorption properties of RF current carrying components. Semiconductor wafer to wafer variability may also result due to absorption properties changing over time, or due to temperature fluctuations.

Typically, line loss measurements are used to calibrate RF generator power and account for RF losses in cables, etc. between the RF power generator and the "antenna" (e.g., RF coil). However, typical calibration methods can only measure power delivery at the input to the impedance matching network, and are unable to compensate for variable power dissipation at locations within the match network, within the electrode or coil assemblies, or in shielding or other components which carry mirror currents. As a result, typical calibration methods can not ensure accurate power delivery into the plasma.

The problem is can be particularly acute when RF current flows on or near components having a magnetic permeability higher than vacuum permeability, or a relatively high resistivity (i.e. higher than copper). Materials known to be associated with variable absorption include, but are not limited to nickel plating, high magnetic permeability alloys such as mu-metal and materials with temperature or time dependent electrical resistivity. Nickel plating is commonly used on RF components in conjunction with silver plating for mil-spec silver plating processes.

As the power actually applied to the plasma in each of a first plasma processing chamber and a second plasma processing chamber is unknown, the first plasma processing chamber and the second plasma processing chamber will not be identical. What is needed is a system, method and apparatus for determining the power actually applied to the plasma so that the plasma in a first plasma processing chamber can be much more closer to identical to the plasma in a second plasma processing chamber.

SUMMARY

Broadly speaking, the present invention fills these needs by providing a system, method and apparatus for determining the power actually applied to the plasma in a given plasma chamber. It should be appreciated that the present invention can be implemented in numerous ways, including as a process, an apparatus, a system, computer readable media, or a device. Several inventive embodiments of the present invention are described below.

The systems and methods described herein use no plasma condition characterization slope of a target plasma chamber and a no plasma condition characterization slope of an actual or hypothetical reference plasma chamber and a voltage or current measurement obtained during an initial plasma processing of the target chamber to calculate an adjusted power set point. The adjusted power set point is configured to cause power delivered to a plasma formed in the target chamber to match power that would be delivered to a reference plasma formed in the reference chamber.

One embodiment includes a method of applying power to a target plasma chamber. The method includes characterizing a no plasma performance slope of the target plasma chamber, the target plasma chamber including an RF electrode and a matching network, applying a selected plasma recipe to a first wafer in the target chamber, the selected plasma recipe including a selected power set point value, wherein applying the selected plasma recipe includes monitoring a recipe factor value on the RF electrode during the application of the selected plasma recipe. The method also includes receiving a no plasma performance slope of a reference chamber, generating a ratio of process efficiency comparing the reference chamber and the target chamber, the generating using as inputs the no plasma performance slope of the target chamber, the no plasma performance slope of the reference chamber and the monitored recipe factor value. A compensation factor is calculated by multiplying the generated ratio with the selected power set point value and the compensation factor is applied to the selected power set point value to produce an adjusted power set point value, the adjusted power set point configured to cause power delivered to a plasma formed in the target chamber to match power that would be delivered to a reference plasma formed in the reference chamber. The monitored recipe factor value can be a electrode voltage or a electrode current. The method can be executed by one of software, hardware and software or hardware, the execution using a controller that is interfaced with the target plasma chamber.

Another embodiment provides a plasma processing system including a plasma chamber having a window, an RF electrode disposed over the window, an RF source, a match circuit having an RF output coupled to the RF coil and an RF input coupled to the RF source, a voltage/current sensor having an input coupled to the RF coil, a processed gas source coupled to a process gas inlet on the plasma chamber and a controller coupled to an output of the voltage/current sensor, the RF source, the match circuit and the plasma chamber. The controller including logic on a computer readable medium for characterizing a no plasma performance slope of the plasma chamber, logic on a computer readable medium for applying a selected plasma recipe to a first wafer in the chamber, logic on a computer readable medium for receiving a no plasma performance slope of a reference plasma chamber, logic on a computer readable medium for generating a ratio of process efficiency comparing the reference plasma chamber and the plasma chamber, logic on a computer readable medium for calculating a compensation factor by multiplying the generated ratio with a selected power set point value and logic on a computer readable medium for applying the compensation factor to the selected power set point value to produce an adjusted power set point value, the adjusted power set point configured to cause power delivered to a plasma formed in the plasma chamber to match power that would be delivered to a reference plasma formed in the reference plasma chamber.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Figure 1:
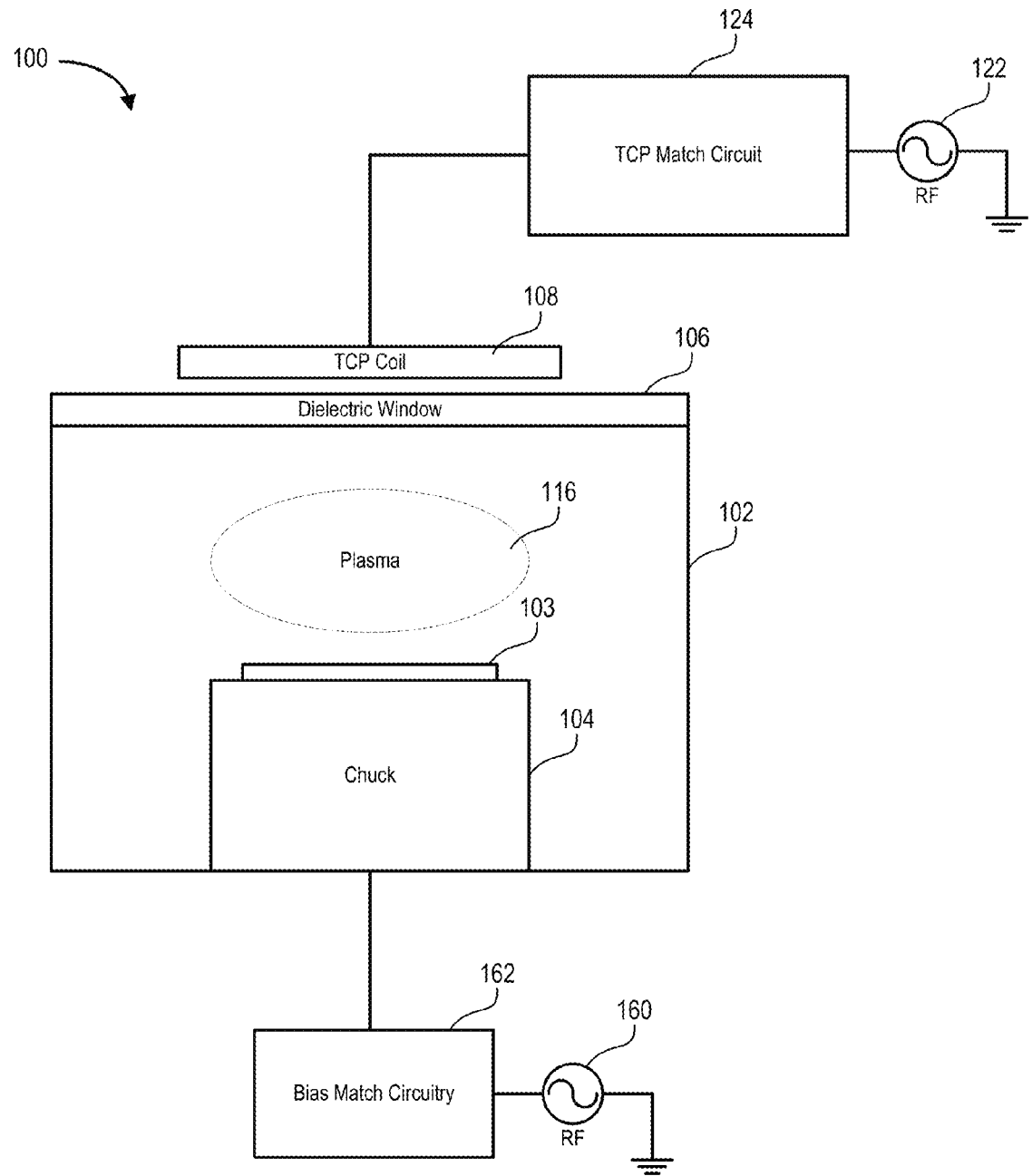
FIG. 1 illustrates a typical plasma processing chamber system.

Several exemplary embodiments for a system, method and apparatus for determining the power actually applied to the plasma in a given plasma chamber will now be described. It will be apparent to those skilled in the art that the present invention may be practiced without some or all of the specific details set forth herein.

One embodiment measures the RF absorption properties of the RF delivery system and actively compensating the power setpoint to deliver the desired amount of power to the plasma. The dissipation is measured by applying RF power to the RF delivery system in a "no-plasma" state, (i.e. with the plasma turned off). The plasma is turned off by pressurizing the plasma a chamber to a pressure of between about 5 and about 15 torr. The higher pressure prevents the plasma from igniting. In one example, the plasma chamber is pressurized to about 9 torr.

The power delivered to the matching network is monitored and compared to the current and/or voltage measured at a location on the RF coil. Power is proportional to Current, I, (or voltage, V,) squared. The power is swept through a range of values to establish the ratio of $I^2/P$ (or $V^2/P$). This ratio is recorded as a no plasma characteristic slope determined by plotting $I^2$ vs. P, fitting the data to a line, and determining the characteristic slope of the line. The no plasma characteristic slope value provides a measure of a quantity of power that is dissipated in the RF delivery system downstream of the calibration point at the input of the matching network, per unit current or per unit voltage.

During plasma operation, the voltage and/or current applied to the coil is monitored, and the no plasma characteristic slope value is used to determine the amount of power that is dissipated in the RF delivery system. This provides a real-time measure of RF power absorption downstream of the matching network input and, in combination with accurate calibration at the matching network input, a measure of the actual power being delivered into the plasma.

The characteristic slope value for each of a population of chambers may be measured so that the power dissipation properties of each chamber are known. The plasma impedance under identical process conditions is the same from one plasma chamber to another plasma chamber. A single plasma chamber can, in substantially real time, calculate (1) the actual power being delivered into the plasma for that chamber and (2) the actual power delivered into the plasma for any other chamber for which a corresponding no plasma characteristic slope value is known.

This information can be used in several ways. First, the real-time calculation for actual power delivery to the plasma may be used with feedback control to maintain a desired set point for actual power delivered into the plasma, such that all chambers deliver the same power to their respective plasmas. As a result, any power losses between the input to the matching network and the plasma are effectively calibrated out or compensated for.

Second, a population of plasma processing chambers can all be programmed to target the power delivery efficiency of a single reference chamber i.e. a selected "golden plasma chamber" so that all plasma chambers deliver the same power to their respective plasmas as the selected golden plasma chamber.

Third, a population of chambers may all be programmed to target the power delivery efficiency of an arbitrary reference standard, i.e. an idealized plasma chamber, so that all chambers deliver the same power to their respective plasmas, with no actual chamber having been selected as a golden tool.

As described above, typical RF calibration systems and methods are only able to calibrate RF losses which occur before the input to the matching network where the calibration standard/meter is coupled. Due to size, geometry and connector compatibility, calibration meters are installed at the location where the RF cable connects to the input of the RF matching network. As a result, any RF dissipation which occurs within the matching network, the electrode coil, the feed-rod, the chamber lid assembly, shielding and any associated return paths that are typically un-calibrated and prone to unit-to-unit variability. Due to this limitation, existing RF calibration systems and methods leave a substantial amount of variability un-calibrated.

The method disclosed here allows for accurate calibration of RF power losses which occur downstream from the RF input to the matching network. As a result, accurate power delivery to the plasma can be ensured. Power dissipation variability in components such as RF impedance matching networks, coils, electrode assemblies, and shielding can be compensated for and substantially eliminated.

FIG. 1 illustrates a typical plasma processing chamber system 100. The plasma processing chamber system 100 includes a plasma chamber 102, having a substrate support or chuck 104 within the plasma chamber. A substrate 103 to be processed is supported on the chuck 104. The plasma chamber 102 includes a dielectric window 106 in the top surface of the plasma chamber. A TCP coil 108 is disposed externally to an aligned with the dielectric window 106. A first match circuit 124 is coupled to the TCP coil 108. A first RF source 122 is coupled to an input of the first match circuit 124. A second match circuit 162 is coupled to the chuck 104. A second RF source 160 is coupled to an input of the second match circuit 162.

In operation, one or more processing gases are injected into the plasma chamber 102. The TCP coil 108 excites the one or more processing gases to generate the plasma 116 between the substrate 103 to be processed and the dielectric window 106. Ions and radicals from the plasma 116 interact with the surface of the substrate 103.

Figure 2A:
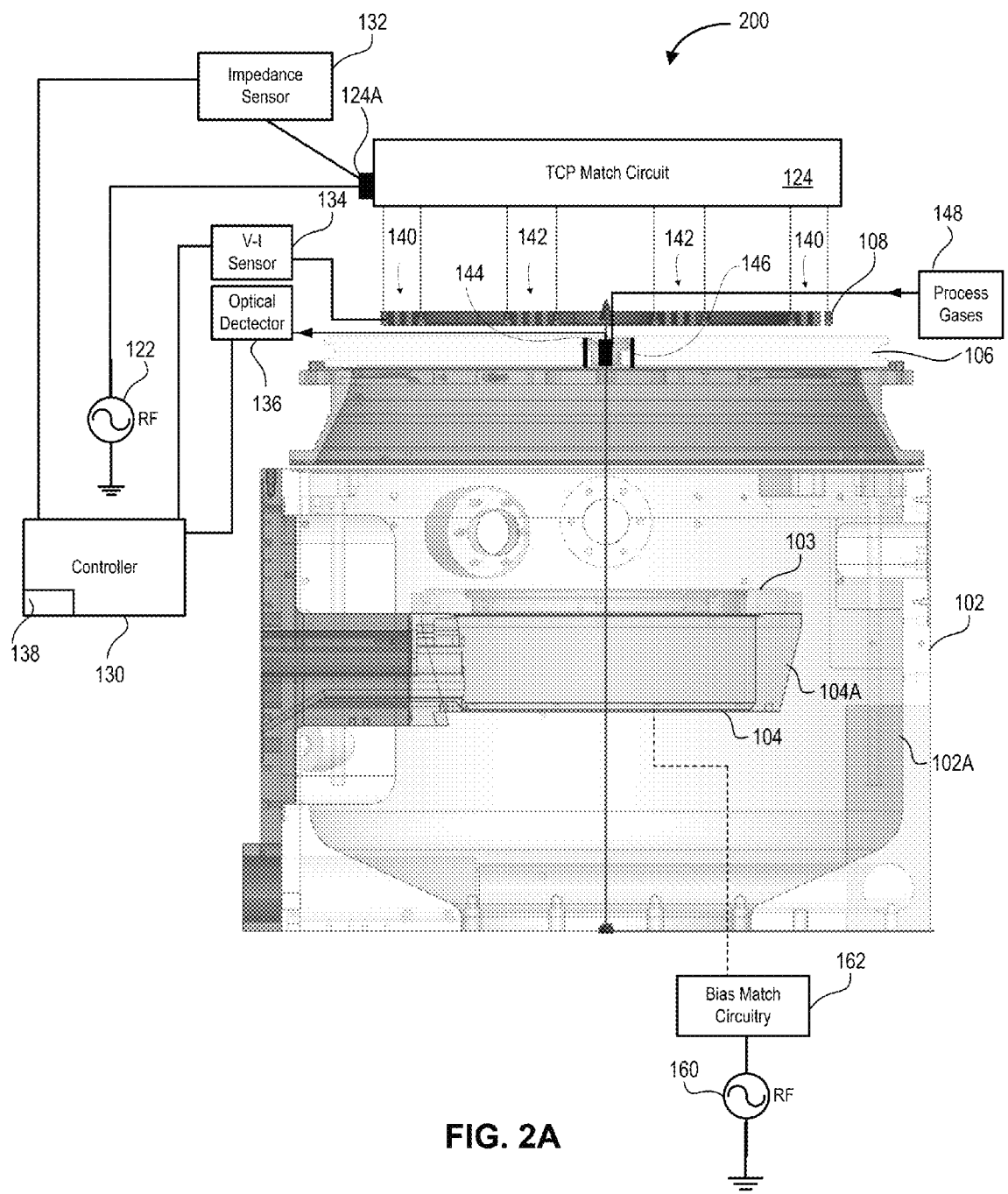
FIG. 2A illustrates a more detailed view of a plasma processing system, in accordance with embodiments of the present invention.

FIG. 2A illustrates a more detailed view of a plasma processing system 200, in accordance with embodiments of the present invention. The plasma processing system 200 includes all the components of the plasma processing system 100 along with a controller 130, a process gas source(s) 148, and impedance sensor 132, an optical detector 136 and a voltage current sensor 134. The TCP coil 108 is divided into an inner coil 142 and an outer coil 140. Additional details include a perimeter RF feed 104A for the chuck 104 and perimeter RF return path 102A.

The process gases are injected into the plasma chamber 102. By way of example, the process gases are injected through an injection port 146. The injection port 106 can be an annular port substantially centered in the dielectric window 106.

An optical port 144 is also substantially centered in the dielectric window 106. The optical port 144 provides a light path for the optical detector 136 to detect emissions from the plasma 116 (not shown). Optical detector 136 can also be coupled to the controller 130 to provide a currently monitored optical signal value (e.g., an intensity, an optical spectrum, or other optically detectable aspects of the plasma 116), to the controller. The controller 130 can use the currently monitored optical signal value from the optical detector 136 as a feedback signal for controlling the processes within the plasma chamber 102.

The voltage current sensor 134, is electrically coupled to at least one of the inner coil 142 and/or the outer coil 140 of the TCP coil 108. The voltage current sensor 134 can detect the voltage and/or current in the inner coil 142 and/or the outer coil 140. Voltage current sensor 134 can also be coupled to the controller 130 to provide a currently monitored voltage and/or current value to the controller. The controller 130 can use the currently monitored voltage and/or current value from the voltage current sensor 134 as a feedback signal for controlling the processes within the plasma chamber 102.

The impedance sensor 132 is coupled to the input 124A of the match circuit 124. Impedance sensor 132 monitors the impedance between the first RF source 122 and the input 124A of the match circuit 124. The impedance sensor 132 can also be coupled to the controller 130 to provide a currently monitored impedance value to an impedance matching logic 138 in the controller. The impedance matching logic 138 can use the currently monitored impedance value from the impedance sensor 132 as a feedback signal for controlling the first RF source 122 and/or the match circuit 124.

Figure 2B:
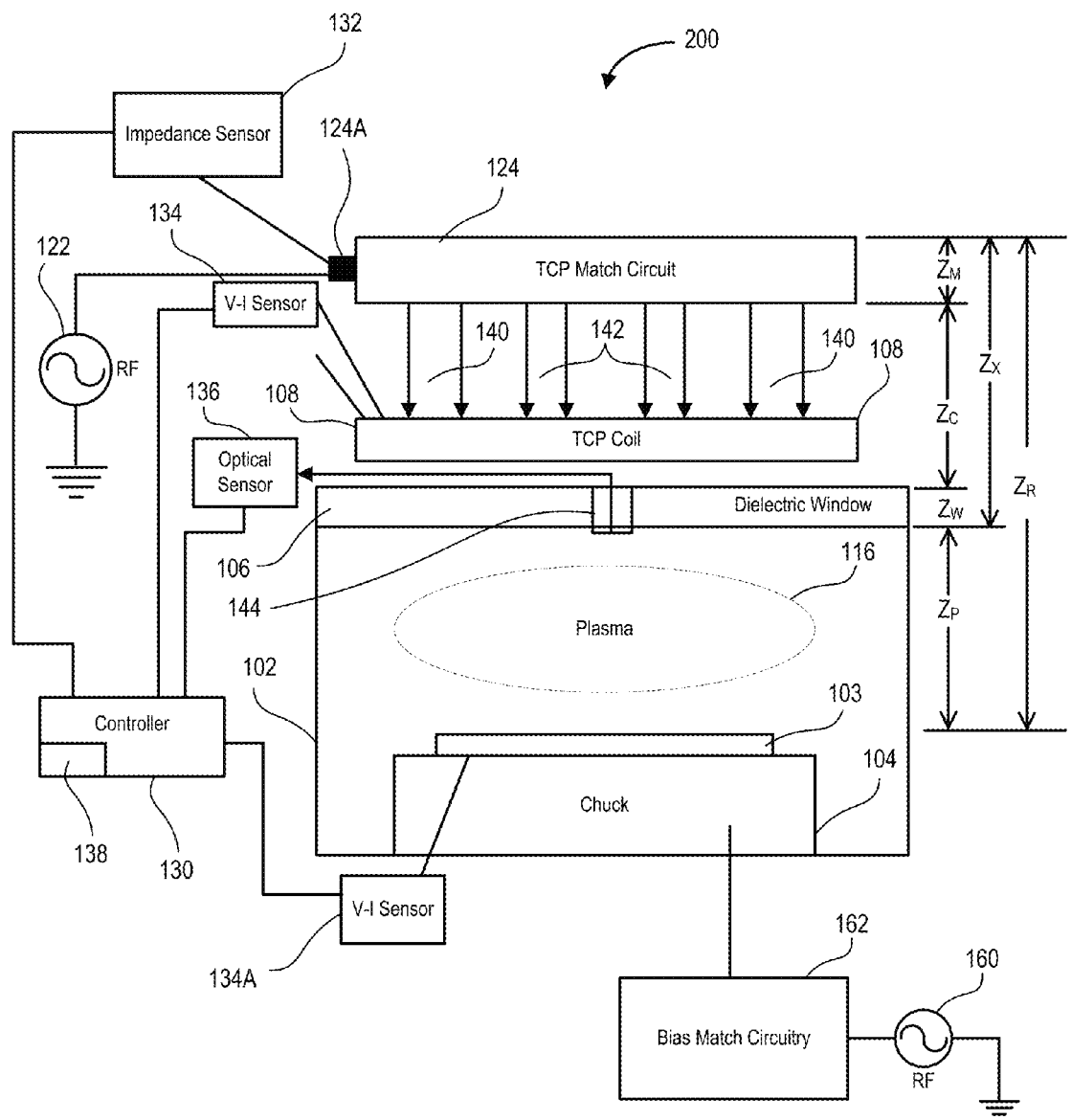
FIG. 2B illustrates the total impedance $Z_R$ of the plasma chamber, in accordance with embodiments of the present invention.

FIG. 2B illustrates the total impedance $Z_R$ of the plasma chamber 102, in accordance with embodiments of the present invention. The total impedance $Z_R$ of the plasma chamber 102 is measured between the input of the match circuit 124A and the substrate 103 being processed. The total impedance $Z_R$ is a function of four component impedances: $Z_M$ is the impedance of the match circuit 124. $Z_C$ is the impedance of the coil 108. $Z_W$ is the impedance of the dielectric window 106. $Z_P$ is the impedance of the plasma 116.

The match circuit 124 adjusts the matching circuit impedance $Z_M$ to match the output impedance of the first RF source 122. The match circuit 124 adjusts the matching circuit impedance $Z_M$ to compensate for variations in the remaining component impedances $Z_C$, $Z_W$ and $Z_P$ due to physical variations in each of the respective portions 108, 106 and 116 of the plasma processing system 200. It is unlikely that the match circuit 124 and the first RF source 122 can supply the same power to the plasma 116 in two different plasma chambers 102 because each of the component impedances $Z_M$, $Z_C$, $Z_W$ and $Z_P$ and the corresponding power losses can vary.

One approach to supply the same power to the plasma 116 in two different plasma chambers 102 is to determine a respective composite impedance $Z_X$ of the combination of the matching circuit impedance $Z_M$, the coil impedance $Z_C$ and the dielectric window impedance $Z_W$ of each of the plasma chambers. If the respective composite impedance $Z_X$ of each of the plasma chambers 102 is known, and the power input to each of the plasma chambers is known, then the power applied to the plasma 116 in each of the plasma chambers can be equalized.

The plasma chamber 102 can also include a second match circuit 162 is coupled to the wafer support (e.g., electrostatic chuck, ESC) 104. A second RF source 160 is coupled to an input of the second match circuit 162. A second voltage current sensor 134A can also be included. The voltage current sensor 134A can also be coupled to the controller 130 so the controller can monitor the voltage and/or current on the electrode portion of the ESC 104.

Figure 3A:
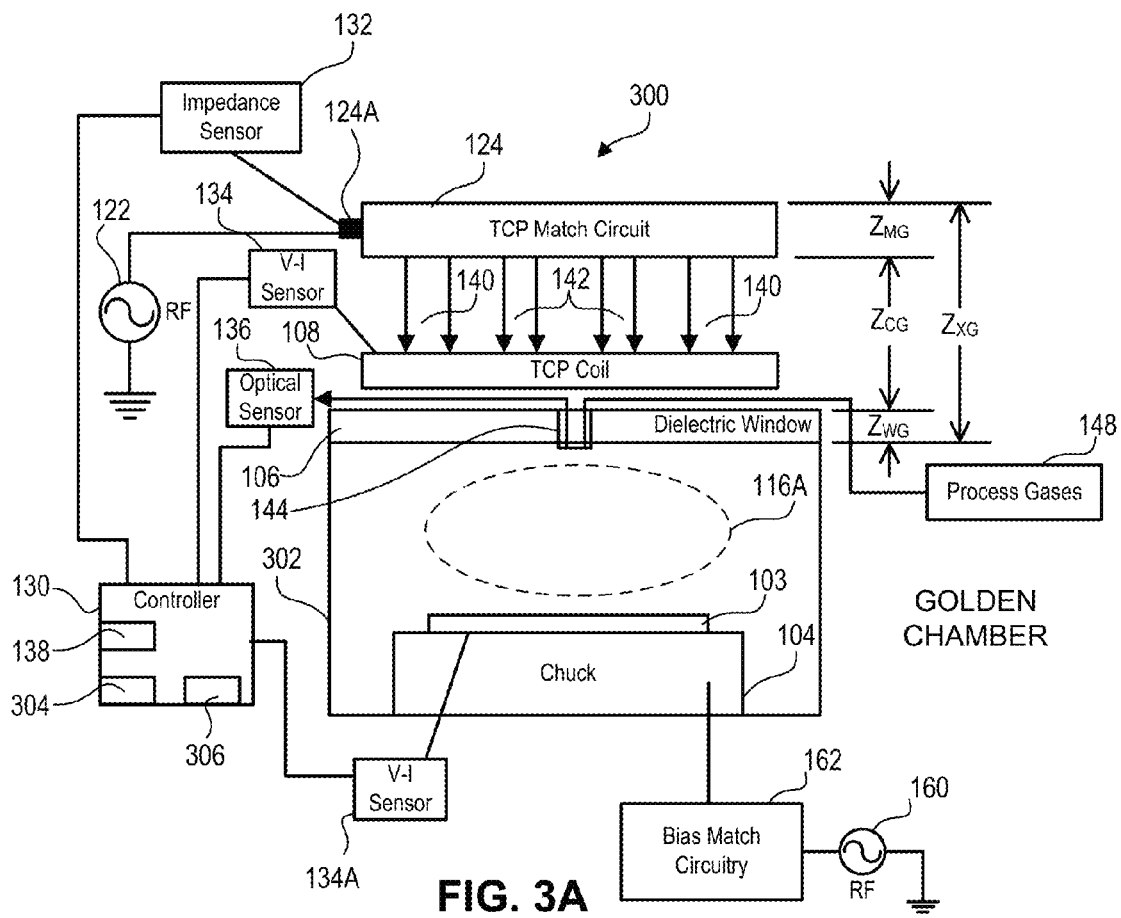
FIG. 3A illustrates a composite impedance $Z_{XG}$ of a reference or "golden" plasma processing system, in accordance with embodiments of the present invention.

FIG. 3A illustrates a composite impedance $Z_{XG}$ of a reference or "golden" plasma processing system 300, in accordance with embodiments of the present invention. As described above, the composite impedance $Z_{XG}$ of the combination of the matching circuit impedance $Z_{MG}$, the coil impedance $Z_{CG}$ and the dielectric window impedance $Z_{WG}$ and the corresponding losses of the golden plasma chamber 302. Controller 130 includes logic 304 for characterizing a no plasma performance slope of the plasma chamber.

Figure 3C:
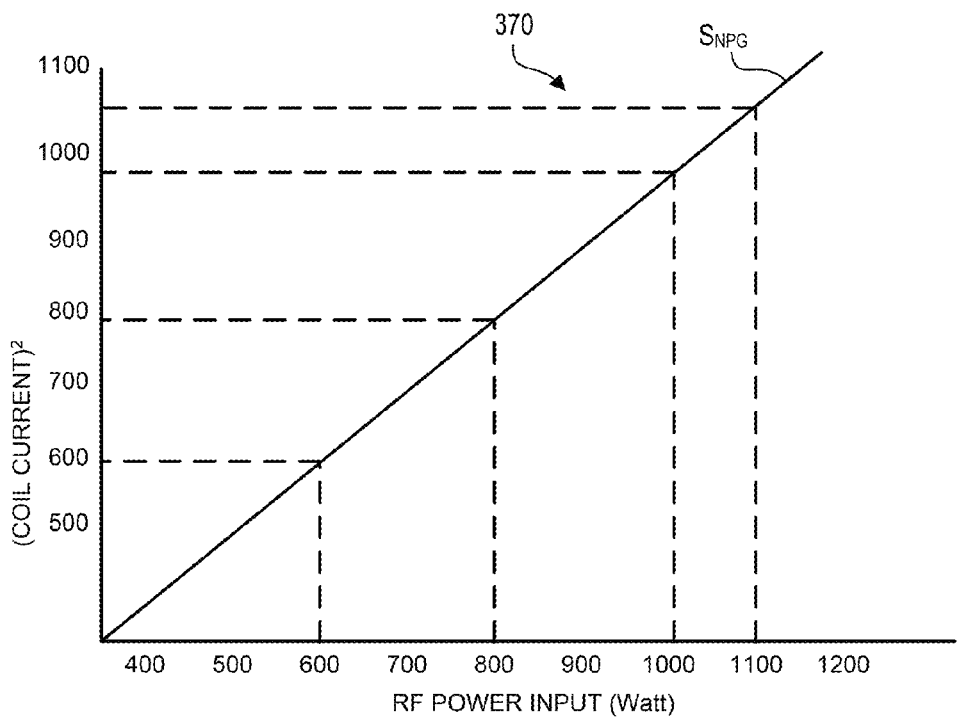
FIG. 3C is a graph of the detected current value relative to the corresponding present power level in the golden chamber, in accordance with embodiments of the present invention.
Figure 3B:
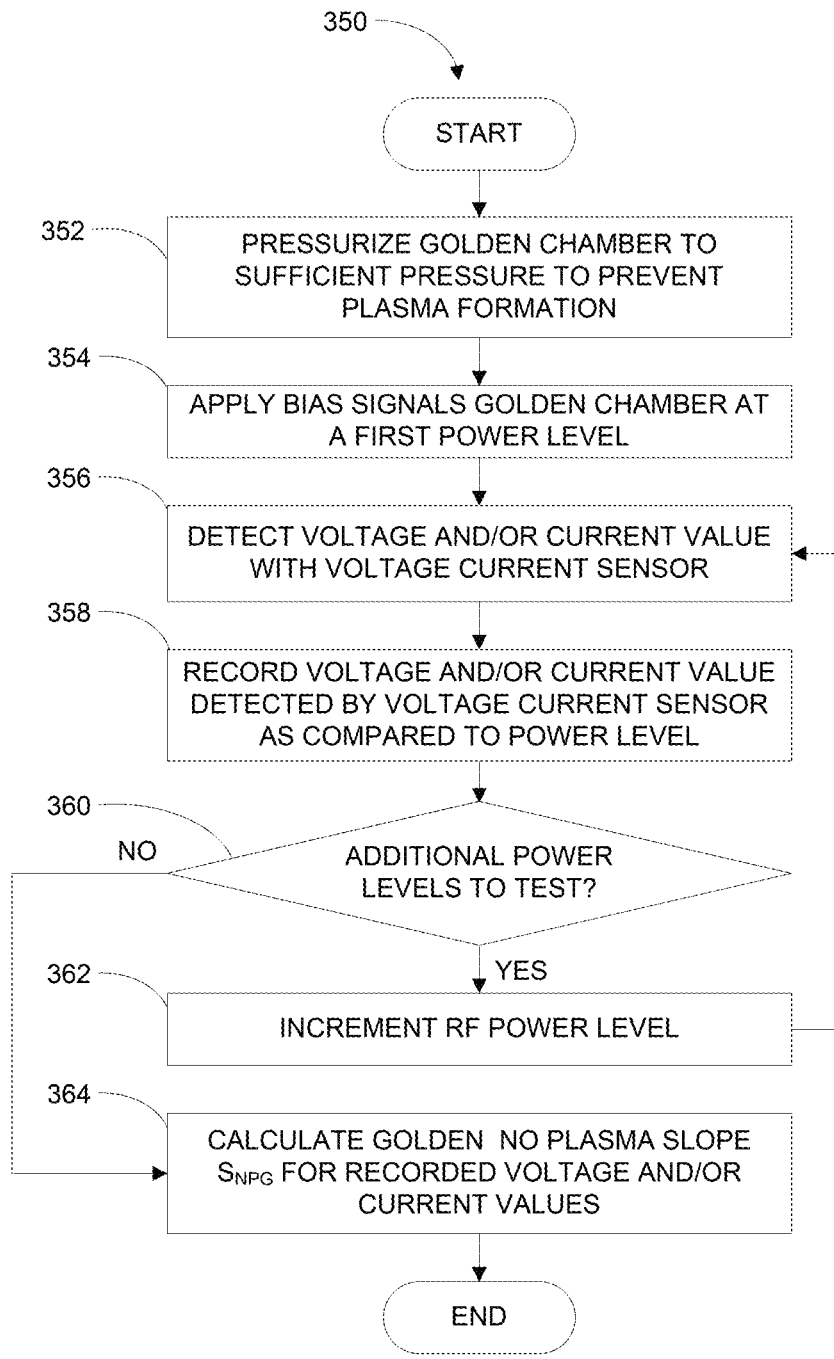
FIG. 3B is a flowchart of the method, operations for determining a no plasma slope $S_{NPG}$ characteristic of the golden plasma chamber, in accordance with embodiments of the present invention.

FIG. 3B is a flowchart of the method, operations 350 for determining a no plasma slope $S_{NPG}$ characteristic of the golden plasma chamber 302, in accordance with embodiments of the present invention. The no plasma slope $S_{NPG}$ characteristic of the golden plasma chamber 302 can be used as a reference or goal used to adjust other plasma chambers to accurately mimic the plasma operations of the golden plasma chamber.

In an operation 352, the golden chamber 302 is pressurized to sufficient pressure to prevent plasma formation. It can be difficult to produce plasma at a pressure greater than about 3 Torr, thus a suitable non-plasma pressure can be between about 5 and about 15 Torr. As an example, the golden chamber 302 is pressurized to about 9 Torr. It should be understood that 9 Torr is used only for example purposes and other pressures can also be used. The frequency, temperature and currents/voltages inputs during the no plasma characterization process are substantially similar to the process set points that will be used in plasma processing wafers in the plasma chamber 402, described below. The frequency, temperature and currents/voltages used for the no plasma characterization test are substantially similar to process set points so that the dissipated power level is similar during the no plasma characterization as during the actual plasma processing. It should be noted that the actual applied power may not be similar, as the plasma processing can consume the major portion of the input power. The gases used during the no plasma characterization test are not required to be similar to process conditions as there will be no actual plasma being formed. By way of example an inert gas such as nitrogen can be used during the no plasma characterization. The gas is non conductive and does not participate in the electrical circuit, except to prevent plasma breakdown during the no plasma characterization.

In an operation 354, bias signals are input to the golden chamber 302 at a first power level. The RF source 122 outputs the selected RF signal to the input 124A of the match circuit 124. The RF signal passes through the match circuit 124 to the coil 108. A corresponding electric field is induced through the window 106 to the plasma area 116A of the golden chamber 302. It should be understood that a corresponding RF signal may also be applied to the electrostatic chuck 104.

In an operation 356, a voltage and/or current value is detected by voltage current sensor. The detected voltage and/or current value is recorded with the corresponding present power level, in an operation 358. FIG. 3C is a graph 370 of the detected current value relative to the corresponding present power level in the golden chamber 302, in accordance with embodiments of the present invention. It should be understood that even though the square of the current is shown in the graph 370, the voltage could similarly be recorded and/or graphed relative to the corresponding present power level.

The no plasma slope determines power losses in the top end, including power losses in the match circuit 124, power losses in the coil 108 and power losses due to the window 106. The ratio of (Voltage)²/input RF power provides the slope. Similarly, the ratio of (Current)²/input RF power will also provide the slope. The slope is inversely proportional to power loss meaning that a higher slope indicates a lower power loss due to the top end components 124, 108, 106.

If there are additional power levels to test as determined in operation 360, the method operations continue in an operation 362. In operation 362, the RF power level is incremented to a different RF power level and the method operations continue in operation 356 as described above.

If there are no additional power levels to test as determined in operation 360, the method operations continue in an operation 364. In operation 364, a golden no plasma slope $S_{NPG}$ for recorded voltage and/or current values is calculated.

It should be understood that the foregoing method operations of determining a no plasma slope for a golden plasma chamber are merely one example of how a reference no plasma slope may be produced. Other examples include a calculated slope determined abstractly without actually measuring a chamber. Yet another example reference no plasma slope can be an average or a median or any other suitable function of the corresponding no plasma slopes for each of a selected group of plasma chambers.

In one embodiment the above process can be used to determine the no plasma characterization of the plasma chamber by monitoring the voltage and/or current on the ESC 104 using the voltage current sensor 134A.

Figure 4A:
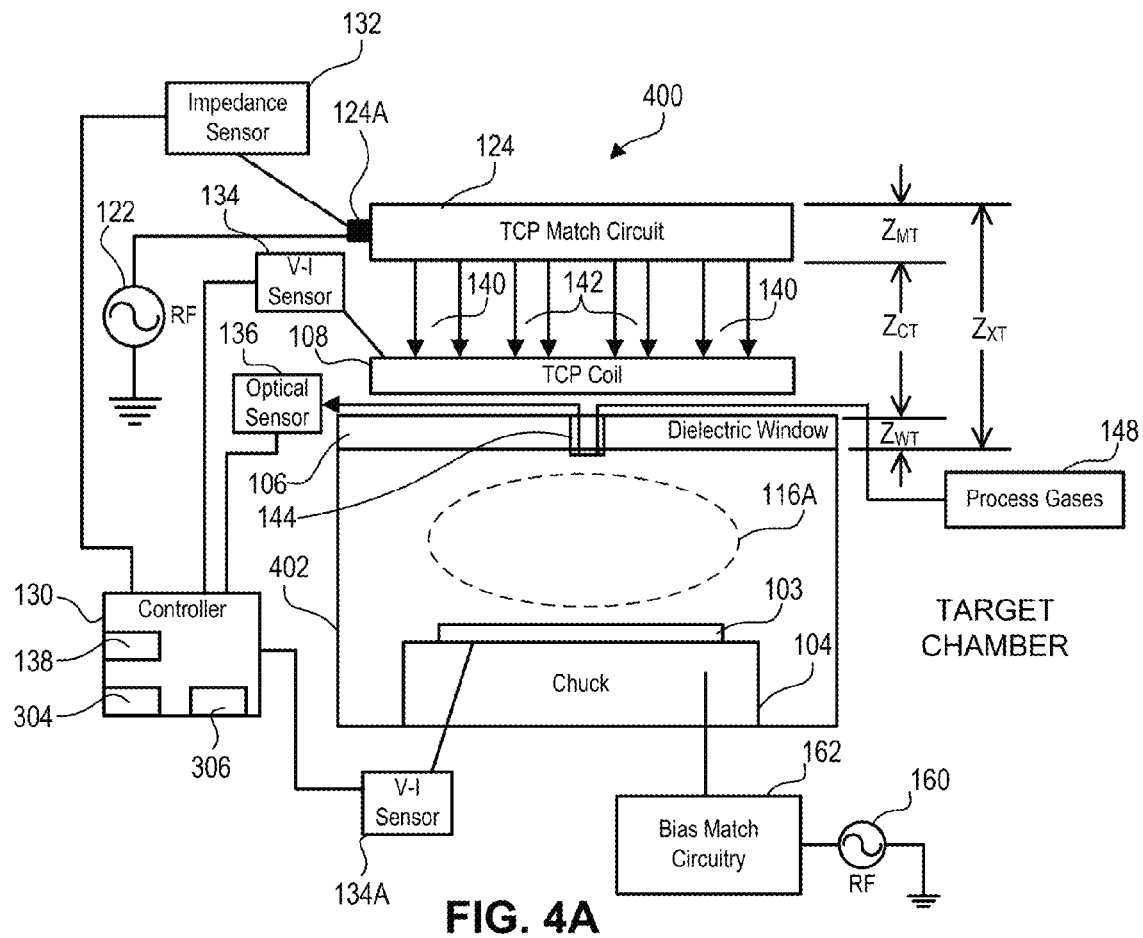
FIG. 4A illustrates a composite impedance $Z_{XT}$ of a target plasma processing system, in accordance with embodiments of the present invention.

FIG. 4A illustrates a composite impedance $Z_{XT}$ of a target plasma processing system 400, in accordance with embodiments of the present invention. As described above, the composite impedance $Z_{XT}$ is the combination of the matching circuit impedance $Z_{MT}$ the coil impedance $Z_{CT}$ and the dielectric window impedance $Z_{WT}$ of the target plasma chamber 402.

Figure 4C:
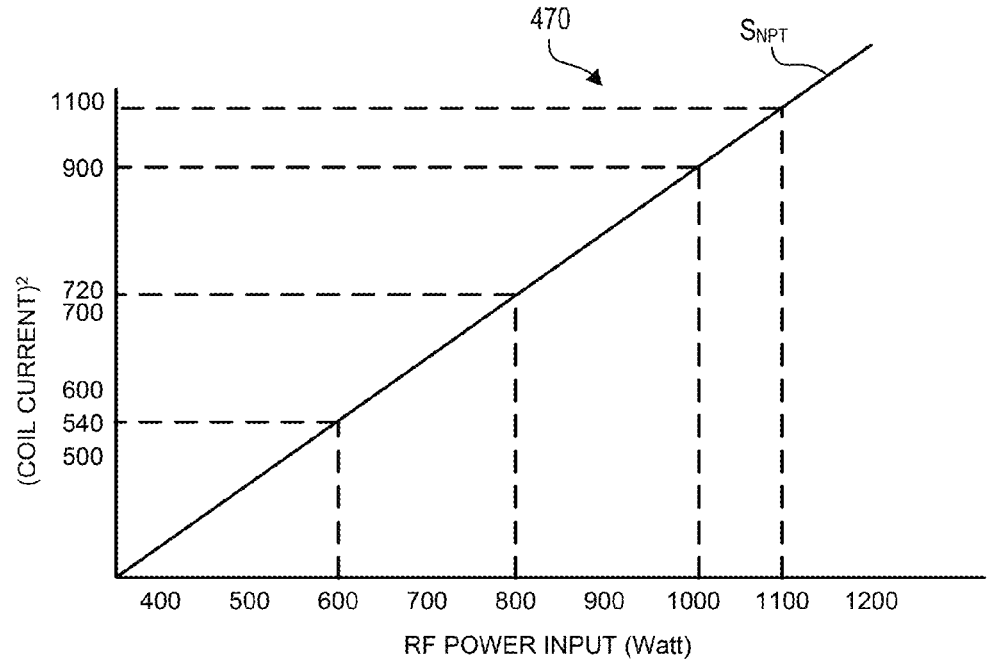
FIG. 4C is a graph of the detected current value relative to the corresponding present power level in the target chamber, in accordance with embodiments of the present invention.
Figure 4B:
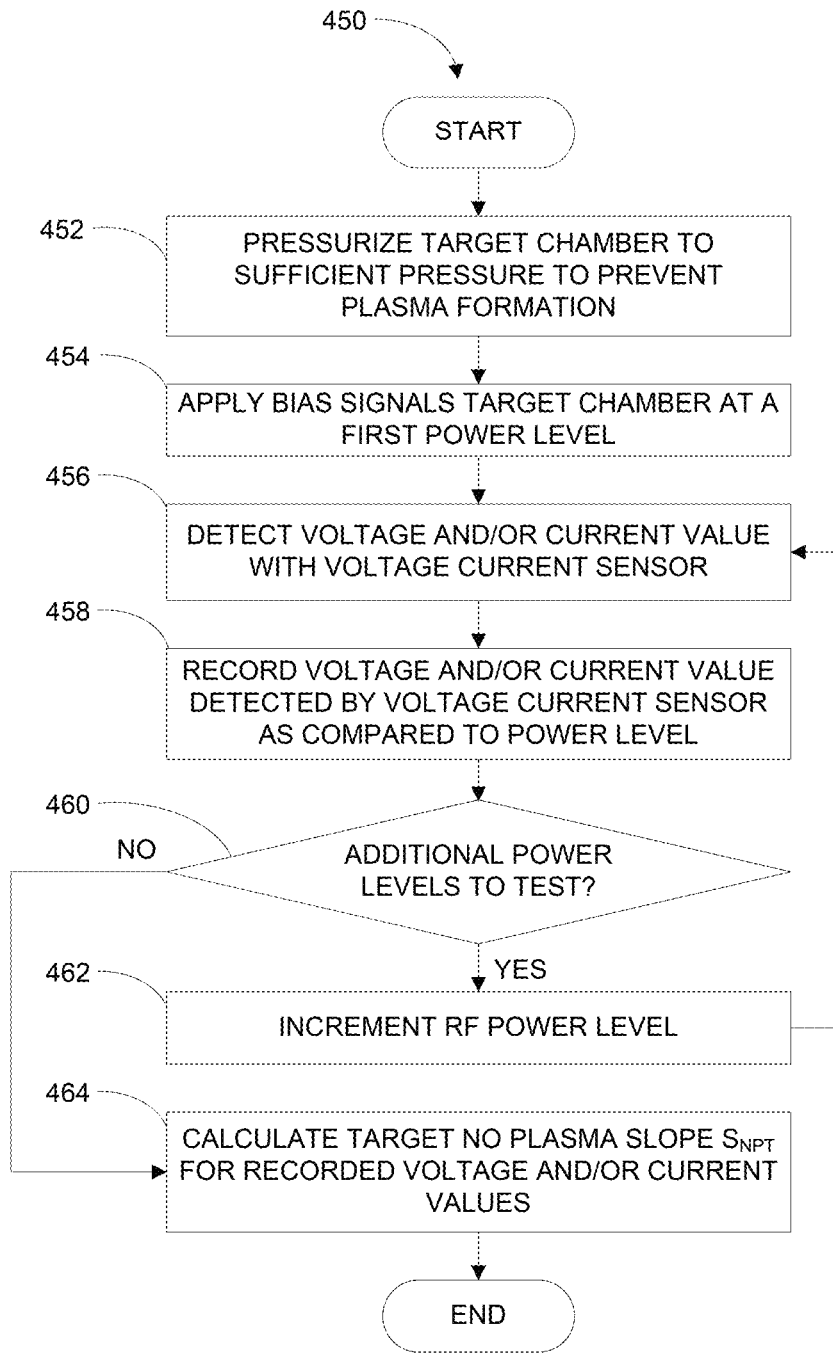
FIG. 4B is a flowchart of the method, operations for determining a no plasma slope $S_{NPT}$ characteristic of the target plasma chamber, in accordance with embodiments of the present invention.

FIG. 4B is a flowchart of the method, operations 450 for determining a no plasma slope $S_{NPT}$ characteristic of the target plasma chamber 402, in accordance with embodiments of the present invention. In an operation 452, the target chamber 402 is pressurized to sufficient pressure to prevent plasma formation.

In an operation 454, bias signals are input to the target chamber 402 at a first power level. The RF source 122 outputs the selected RF signal to the input 124A of the match circuit 124. The RF signal passes through the match circuit 124 to the coil 108. A corresponding electric field is induced through the window 106 to the plasma area 116A of the target chamber 402. It should be understood that a corresponding RF signal may also be applied to the electrostatic chuck 104.

In an operation 456, a voltage and/or current value is detected by voltage current sensor. The detected voltage and/or current value is recorded with the corresponding present power level, in an operation 458. FIG. 4C is a graph 470 of the detected current value relative to the corresponding present power level in the target chamber 402, in accordance with embodiments of the present invention. It should be understood that even though the square of the current is shown in the graph 470, the voltage could similarly be recorded and/or graphed relative to the corresponding present power level.

If there are additional power levels to test as determined in operation 460, the method operations continue in an operation 462. In operation 462, the RF power level is incremented to a different RF power level and the method operations continue in operation 456 as described above.

If there are no additional power levels to test as determined in operation 460, the method operations continue in an operation 464. In operation 464, a target no plasma slope $S_{NPT}$ for recorded voltage and/or current values is calculated.

Figure 5:
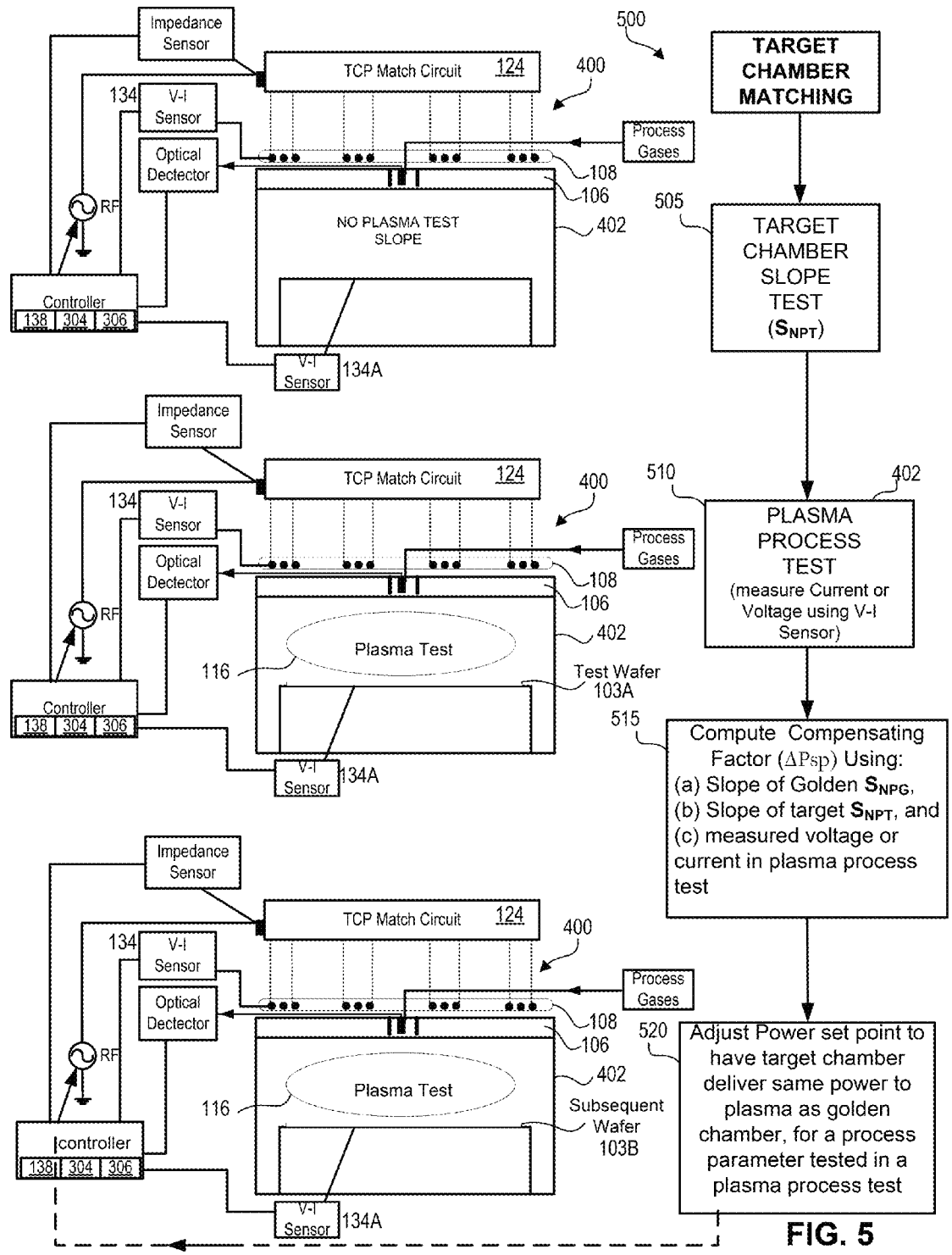
FIG. 5 is a flowchart of the method, operations for adjusting the plasma slope $S_{PT}$ of the target plasma chamber, in accordance with embodiments of the present invention.

FIG. 5 is a flowchart of the method, operations 500 for adjusting the plasma slope $S_{PT}$ of the target plasma chamber 402, in accordance with embodiments of the present invention. In an operation 505, the no plasma slope $S_{NPT}$ characteristic of the target plasma chamber 402 is determined as described in FIG. 4B above.

In an operation 510, a plasma process is applied to a test wafer 103A in the target plasma chamber 402 and an initial plasma process voltage $V_{PT}$ and/or current $I_{PT}$ is determined. The initial plasma process voltage $V_{PT}$ and/or current $I_{PT}$ are measured as described above in FIG. 4B when determining the no plasma slope $S_{NPT}$ characteristic of the target plasma chamber 402. During the initial plasma process, the process gases are set at a desired plasma processing pressure and mixture, a plasma 116 is generated in the target plasma chamber 402 and only a single RF power level at the desired RF power level set point is used. The precise recipe including all of the various operational set points of process gas pressures, mixtures, RF signal frequency and power, timing, temperature and other operational variables for the initial plasma process is determined by a desired process recipe corresponding to the desired process to be conducted within the target plasma chamber 402.

In an operation 515, a compensating factor is calculated using the no plasma slope $S_{NPG}$, no plasma slope $S_{NPT}$ and the initial plasma process voltage $V_{PT}$ and/or current $I_{PT}$.

The efficiency ($\eta_{top}$) of the top end components 124, 108, 106 of a given plasma chamber 402 is determined as set forth in Formula 1:

$$\eta_{top} = 1 - V^2/(SP_{sp}) = R_p/(R_{top}+R_p) \quad \text{Formula 1}$$

$$\eta_{Ttop} = 1 - V_T^2/(S_T P_{sp}) \quad \text{Efficiency of Target Chamber}$$

$$\eta_{Gtop} = 1 - V_T^2/(\eta_{Ttop} S_G P_{sp}) \quad \text{Efficiency of Golden Chamber}$$

A ratio of process efficiency in power being delivered at same RF power input in the golden chamber 302 and the target chamber 402 can be determined by the following Formula 2:

$$P_{sp}(\eta_{Gtop} - \eta_{Ttop}) \quad \text{Formula 2}$$

The compensating factor $\Delta P_{sp}$ to be applied to the power set point to apply the same power to the plasma in the target chamber 402 as in the golden chamber 302 can be determined in the following Formula 3:

$$\Delta P_{sp} = P_{sp}(\eta_{Gtop} - \eta_{Ttop})/\eta_{Ttop} \qquad \text{Formula 3}$$

In an operation 520, the desired RF power level set point is adjusted according to the compensating factor. In an operation 525, the test wafer 103A is removed and a subsequent wafer 103B is placed in the target chamber 402. The same plasma process applied to the test wafer 103A in operation 510 is applied to the subsequent wafer 103B using the compensated RF signal power level set point.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below. By way of example the controller 130 can also include logic 306 for generating a ratio of process efficiency comparing the reference plasma chamber and the plasma chamber, logic for calculating a compensation factor by multiplying the generated ratio with a selected power set point value, logic for applying the compensation factor to the selected power set point value to produce an adjusted power set point value, the adjusted power set point configured to cause power delivered to a plasma formed in the plasma chamber to match power that would be delivered to a reference plasma formed in the reference plasma chamber.

Figure 6:
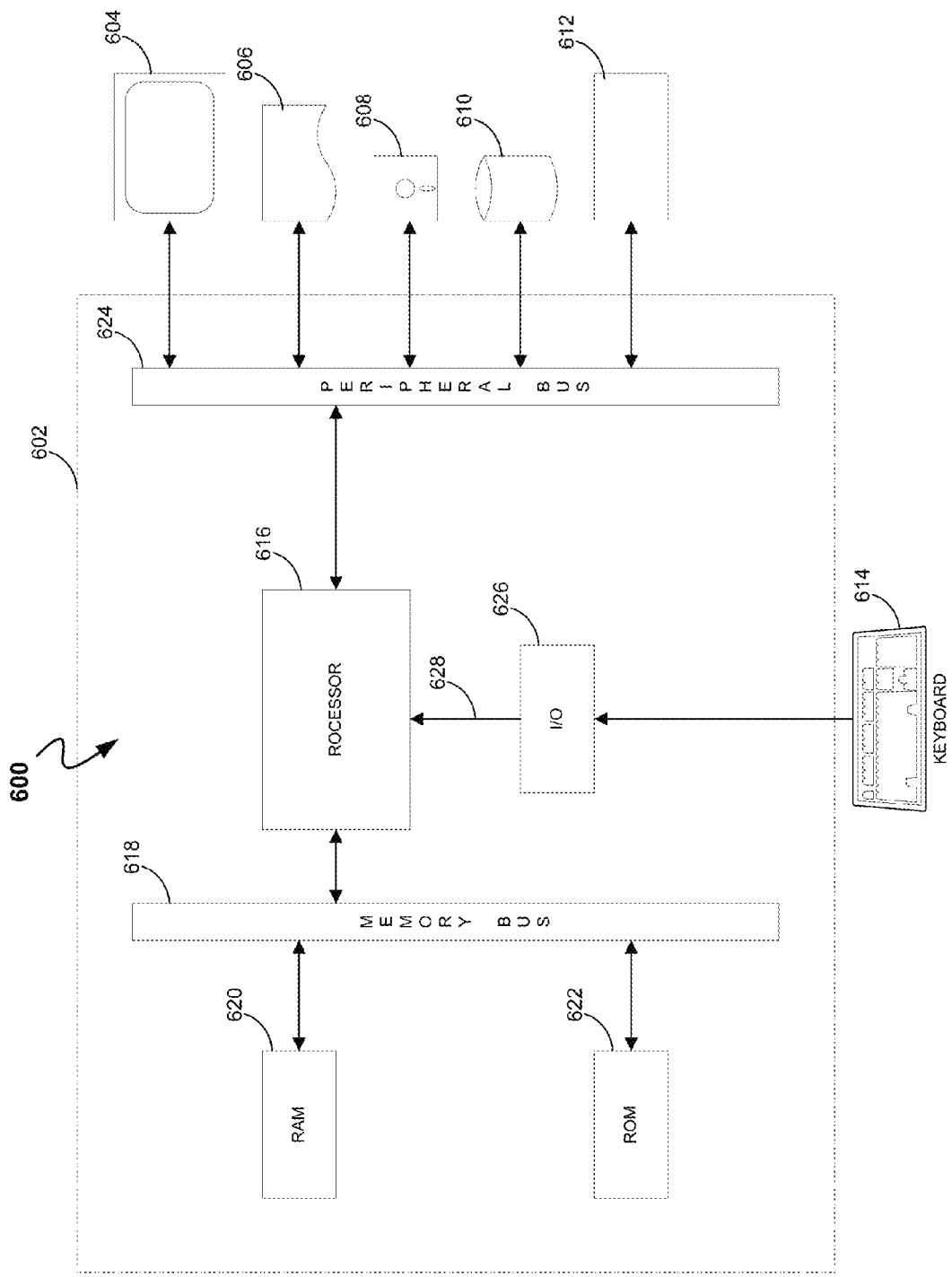
FIG. 6 is a block diagram of an exemplary computer system for carrying out the processing, in accordance with embodiments of the present invention.

FIG. 6 is a block diagram of an exemplary computer system 600 for carrying out the processing, in accordance with embodiments of the present invention. The controller 130 can include a general or specialized computer system such as the computer system 600. The computer system 600 includes a computer 602, a display screen 604, an optional printer 606 or other output device, a removable media (e.g., magnetic/optical/flash) drive 608, a hard disk drive 610 or other suitable storage device, a network interface 612, and a keyboard 614. Additional user interface devices such as a mouse, a touch pad or touch screen can also be included.

The computer 602 includes a processor 616, a memory bus 618, random access memory (RAM) 620, read only memory (ROM) 622, a peripheral bus 624, and an input/output device 626. The computer 602 can be a personal computer (such as an IBM compatible personal computer, a Macintosh computer or Macintosh compatible computer), a workstation computer (such as a Sun Microsystems or Hewlett-Packard workstation), or some other suitable type of computer.

The processor 616 can be a general purpose digital processor or a specially designed processor. The processor 616 controls the operation of the computer system 600. Using instructions retrieved from memory, the microprocessor 616 controls the reception and manipulation of input data and the output and display of data on output devices.

The memory bus 618 is used by the processor 616 to access the RAM 620 and the ROM 622. The RAM 620 is used by the processor 616 as a general storage area and as scratch-pad memory, and can also be used to store input data and processed data. The RAM 620 and the ROM 622 can be used to store computer readable instructions or program code readable by the microprocessor 616 as well as other data.

The peripheral bus 624 is used to access the input, output, and storage devices used by the computer 602. These devices include the display screen 604, the printer device 606, the removable media drive 608, the hard disk drive 610, and the network interface 612. The input/output device 626 is used to receive input from keyboard 614 and send decoded symbols for each pressed key to processor 616 over bus 628.

The display screen 604 is an output device that displays images of data provided by the processor 616 via the peripheral bus 624 or provided by other components in the computer system 600. The printer device 606, when operating as a printer, provides an image on a sheet of paper or a similar surface. Other output devices such as a plotter, projector, etc. can be used in place of, or in addition to, the printer device 606.

The removable media drive 608 and the hard disk drive 610 can be used to store various types of data. The removable media drive 608 facilitates transporting such data to other computer systems, and hard disk drive 610 permits fast access to large amounts of stored data. The hard disk drive 610 may be included within the computer system or may be external to the computer system such as network attached storage or cloud storage accessible over one or more networks (e.g., local area networks, wide area networks, wireless networks, Internet) or combinations of such storage devices and locations.

The processor 616 together with an operating system operate to execute computer readable code and logic and produce and use data. The computer code, logic and data may reside within the RAM 620, the ROM 622, or the hard disk drive 610 or other media storage devices and combinations thereof. The computer code and data could also reside on a removable program medium and loaded or installed onto the computer system 600 when needed. Removable program media include, for example, DVD, CD-ROM, PC-CARD, floppy disk, flash memory, optical media and magnetic disk or tape.

The network interface 612 is used to send and receive data over a network connected to other computer systems. An interface card or similar device and appropriate software implemented by the processor 616 can be used to connect the computer system 600 to an existing network and transfer data according to standard protocols such as local area networks, wide area networks, wireless networks, Internet and any other suitable networks and network protocols.

The keyboard 614 is used by a user to input commands and other instructions to the computer system 600. Other types of user input devices can also be used in conjunction with the present invention. For example, pointing devices such as a computer mouse, a track ball, a stylus, touch pad, touch screen or a tablet can be used to manipulate a pointer on a screen of a general-purpose computer.

The method operations illustrated herein are by way of example, as it should be understood that some operations may have sub-operations and in other instances, certain operations described herein may not be included in the illustrated operations. It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive or other storage media and locations.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, flash memory, random-access memory, DVD, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. Method of applying power to a target plasma chamber, comprising:
    characterizing a no plasma performance slope of the target plasma chamber, the target plasma chamber including a radio frequency (RF) electrode and a match circuit;
    applying a selected plasma recipe to a first wafer in the target chamber, the selected plasma recipe including a selected power set point value, wherein applying the selected plasma recipe includes monitoring a recipe factor value on the RF electrode during the application of the selected plasma recipe;
    receiving a no plasma performance slope of a reference chamber;
    generating a ratio of process efficiency comparing an efficiency of the reference chamber and an efficiency of the target chamber, the generating using as inputs the no plasma performance slope of the target chamber, the no plasma performance slope of the reference chamber and the monitored recipe factor value that is produced based on the selected power set point value, wherein the efficiency of the reference chamber being a function of the efficiency of the target chamber, the no plasma performance slope of the reference chamber, the selected power set point value and the monitored recipe factor value;
    calculating a compensation factor by multiplying the generated ratio with the selected power set point value; and
    applying the compensation factor to the selected power set point value to produce an adjusted power set point value, the adjusted power set point configured to cause power delivered to a plasma formed in the target chamber to match power that would be delivered to a reference plasma formed in the reference chamber;
    wherein the generated ratio does not require data from a monitored recipe in the reference chamber.

2. The method of claim 1, wherein the monitored recipe factor value is a coil voltage and the RF electrode is a coil electrode.

3. The method of claim 1, wherein the monitored recipe factor value is a coil current and the RF electrode is a coil electrode.

4. The method of claim 1, further comprising an electrostatic chuck (ESC) wafer support and wherein the monitored recipe factor value is an ESC voltage and the RF electrode is an ESC electrode.

5. The method of claim 1, further comprising an electrostatic chuck (ESC) wafer support wherein the monitored recipe factor value is an ESC current and the RF electrode is an ESC electrode.

6. The method of claim 1, further comprising,
    removing the first wafer;
    placing a second wafer in the target chamber; and
    performing the selected plasma recipe on the second wafer using the target plasma chamber having the adjusted power set point value.

7. The method of claim 6, wherein performing the selected plasma recipe on the second wafer includes providing the adjusted power set point value to an RF generator of the target plasma chamber.

8. The method of claim 1, wherein the compensation factor quantifies a plurality of differences in RF losses between the match circuit and the RF electrode of the target chamber as compared to the reference chamber.

9. The method of claim 1, wherein the power delivered to the target chamber is RF power applied to the RF electrode of the target chamber, the RF electrode being disposed above a ceramic window that is disposed over a wafer support.

10. The method of claim 1, wherein the received no plasma performance slope of the reference chamber is determined on an existing chamber having desired performance characteristics.

11. The method of claim 1, wherein the received no plasma performance slope of the reference chamber is obtained as a value.

12. The method of claim 1, wherein the method is executed by one of software, hardware and software or hardware, the execution using a controller that is interfaced with the target plasma chamber.

13. The method of claim 1, wherein characterizing the no plasma performance slope of the target plasma chamber includes pressurizing the target plasma chamber with a process gas to a pressure between about 5 and about 15 torr.

14. The method of claim 1, wherein characterizing the no plasma performance slope of the target plasma chamber includes pressurizing the target plasma chamber with a process gas to a pressure of about 9 torr.

15. The method of claim 1, wherein characterizing the no plasma performance slope of the target plasma chamber includes:
    inputting a plurality of power set points to the match circuit;
    recording at least one of a no plasma recipe factor value measured at the RF electrode corresponding to each one of the plurality of power set points;
    plotting a function of the recorded no plasma recipe factor value measured at the RF electrode and the corresponding each one of the plurality of power set points to identify the no plasma performance slope of the target plasma chamber.

16. The method of claim 15, wherein the function of the recorded recipe factor value measured at the RF electrode is a square of the recorded recipe factor value measured at the RF electrode.

17. The method of claim 1, further comprising, saving the compensation factor for the plasma recipe.

18. Method of applying power to a target plasma chamber, comprising:
    characterizing a no plasma performance slope of the target plasma chamber, the target plasma chamber including an RF electrode and a match circuit including:
        inputting a plurality of power set points to the match circuit;
        recording at least one of a no plasma current value measured at the RF electrode corresponding to each one of the plurality of power set points;
        recording a square of the recorded no plasma current value measured at the RF electrode and the corresponding each one of the plurality of power set points to identify the no plasma performance slope of the target plasma chamber;

applying a selected plasma recipe to a first wafer in the target chamber, the selected plasma recipe includes a selected power set point value, wherein applying the selected plasma recipe includes monitoring a recipe current on the RF electrode during the application of the selected plasma recipe;

receiving a no plasma performance slope of a reference chamber;

generating a ratio of process efficiency comparing an efficiency of the reference chamber and an efficiency of the target chamber, the generating using as inputs the no plasma performance slope of the target chamber, the no plasma performance slope of the reference chamber and the monitored recipe current that is produced based on the selected power set point value, wherein the efficiency of the reference chamber being a function of the efficiency of the target chamber, the no plasma performance slope of the reference chamber, the selected power set point value and the monitored recipe current;

calculating a compensation factor by multiplying the generated ratio with the selected power set point value; and applying the compensation factor to the selected power set point value to produce an adjusted power set point value, the adjusted power set point configured to cause power delivered to a plasma formed in the target chamber to match power that would be delivered to a reference plasma formed in the reference chamber;

wherein the generated ratio does not require data from a monitored recipe in the reference chamber.

19. Method of applying power to a target plasma chamber, comprising:

characterizing a no plasma performance slope of the target plasma chamber, the target plasma chamber including an RF electrode and a matching network including:
inputting a plurality of power set points to the matching network;
recording at least one of a no plasma voltage value measured at the RF electrode corresponding to each one of the plurality of power set points;
recoding a square of the recorded no plasma voltage value measured at the RF electrode and the corresponding each one of the plurality of power set points to identify the no plasma performance slope of the target plasma chamber;

applying a selected plasma recipe to a first wafer in the target chamber, the selected plasma recipe including a selected power set point value, wherein applying the selected plasma recipe includes monitoring a recipe voltage on the RF electrode during the application of the selected plasma recipe;

receiving a no plasma performance slope of a reference chamber;

generating a ratio of process efficiency comparing an efficiency of the reference chamber and an efficiency of the target chamber, the generating using as inputs the no plasma performance slope of the target chamber, the no plasma performance slope of the reference chamber and the monitored recipe voltage that is produced based on the selected power set point value, wherein the efficiency of the reference chamber being a function of the efficiency of the target chamber, the no plasma performance slope of the reference chamber, the selected power set point value and the monitored recipe voltage;

calculating a compensation factor by multiplying the generated ratio with the selected power set point value; and applying the compensation factor to the selected power set point value to produce an adjusted power set point value, the adjusted power set point configured to cause power delivered to a plasma formed in the target chamber to match power that would be delivered to a reference plasma formed in the reference chamber;

wherein the generated ratio does not require data from a monitored recipe in the reference chamber.

* * * * *